(12) United States Patent
Kim (10) Patent No.: US 10,332,568 B2
(45) Date of Patent: Jun. 25, 2019

(54) MEMORY APPARATUS AND MEMORY MODULE INCLUDING A POWER MANAGEMENT INTEGRATED CIRCUIT

(71) Applicant: SK hynix Inc., Icheon-si Gyeonggi-do (KR)

(72) Inventor: Kyung Hoon Kim, Seongnam-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 1 day.

(21) Appl. No.: 15/864,283

(22) Filed: Jan. 8, 2018

(65) Prior Publication Data
US 2018/0315459 A1    Nov. 1, 2018

(30) Foreign Application Priority Data

Apr. 26, 2017  (KR) .................. 10-2017-0053754

(51) Int. Cl.
*G11C 5/14* (2006.01)
*G11C 5/04* (2006.01)

(52) U.S. Cl.
CPC ................ *G11C 5/147* (2013.01); *G11C 5/04* (2013.01); *G11C 5/14* (2013.01); *G11C 5/142* (2013.01)

(58) Field of Classification Search
CPC ........... G11C 5/147; G11C 5/14; G11C 5/143; G11C 16/03; G11C 11/4074
See application file for complete search history.

(56) References Cited

U.S. PATENT DOCUMENTS

| | | | | |
|---|---|---|---|---|
| 7,464,225 B2* | 12/2008 | Tsern | ...................... | G11C 5/02 711/115 |
| 7,812,445 B2* | 10/2010 | Baek | ...................... | G11C 5/04 257/686 |
| 7,902,654 B2 | 3/2011 | Choa-Eoan et al. | | |
| 9,520,160 B2* | 12/2016 | Yoon | ...................... | G11C 7/109 |
| 10,008,488 B2* | 6/2018 | Lee | ...................... | H01L 21/4853 |

* cited by examiner

*Primary Examiner* — Pho M Luu
(74) *Attorney, Agent, or Firm* — William Park & Associates Ltd.

(57) ABSTRACT

A memory module includes a module substrate. The module substrate includes a plurality of regions, on which a plurality of memory apparatuses are mounted. A plurality of inductors are formed in the plurality of regions of the memory module substrate, respectively.

19 Claims, 6 Drawing Sheets

MEMORY APPARATUS AND MEMORY MODULE INCLUDING A POWER MANAGEMENT INTEGRATED CIRCUIT

CROSS-REFERENCES TO RELATED APPLICATION

The present application claims priority under 35 U.S.C. § 119(a) to Korean application number 10-2017-0053754, filed on Apr. 26, 2017 in the Korean Intellectual Property Office, which is incorporated herein by reference in its entirety as set forth in full.

BACKGROUND

1. Technical Field

Various exemplary embodiments of the present disclosure relate to a semiconductor technology and, more particularly, to a memory apparatus and a memory module including a power management integrated circuit.

2. Related Art

An electronic device includes many electronic elements, and a computer system includes many electronic elements comprising semiconductor apparatuses. The semiconductor apparatuses of the computer system are operable through supply of an external power. The computer system in general provides appropriate power to each of the semiconductor apparatuses through a power management integrated circuit included therein. Each of the semiconductor apparatuses is operable by the power generated by a general power management integrated circuit because semiconductor apparatuses are manufactured according to a standard. However, because the semiconductor apparatuses are manufactured by different vendors, the semiconductor apparatuses have different characteristics and thus the semiconductor apparatuses hardly operate with maximum performance through a general power management integrated circuit. Therefore, it may be best to increase operation performances of the semiconductor apparatuses to provide a power management integrated circuit for each of the semiconductor apparatuses. However, it is difficult to manufacture semiconductor apparatuses into integrated circuits because an inductor included in the power management integrated circuit has a great size.

SUMMARY

In an embodiment of the present disclosure, a memory module may include: a module substrate including a plurality of regions, on which a plurality of memory apparatuses are mounted, wherein a plurality of inductors are formed in the plurality of regions of the memory module substrate, respectively.

In an embodiment of the present disclosure, a memory module may include: a module substrate, on which a plurality of inductors are formed; and a plurality of memory apparatuses each mounted on the module substrate and each including a power management circuit, wherein the power management circuits of the plurality of memory apparatuses are coupled to the plurality of inductors, respectively.

In an embodiment of the present disclosure, a memory apparatus may include: an on-chip power management circuit coupled to an off-chip inductor, and configured to receive an external power and generate one or more internal voltages; and one or more internal circuits configured to operate by using the one or more internal voltages.

In an embodiment of the present disclosure, a memory module may include: a module substrate including a first inductor formed in a first region and a second inductor formed in a second region; a first memory apparatus mounted on the first region, and including a first power management circuit; and a second memory apparatus mounted on the second region, and including a second power management circuit, wherein the first power management circuit is coupled to the first inductor and generates a memory power voltage and a plurality of internal voltages appropriate to be used by the first memory apparatus, and wherein the second power management circuit is coupled to the second inductor and generates a memory power voltage and a plurality of internal voltages appropriate to be used by the second memory apparatus.

BRIEF DESCRIPTION OF THE DRAWINGS

Features, aspects and embodiments are described in conjunction with the attached drawings, in which.

DETAILED DESCRIPTION

Hereinafter, a semiconductor apparatus according to the present disclosure will be described below with reference to the accompanying drawings through exemplary embodiments.

Figure 1:
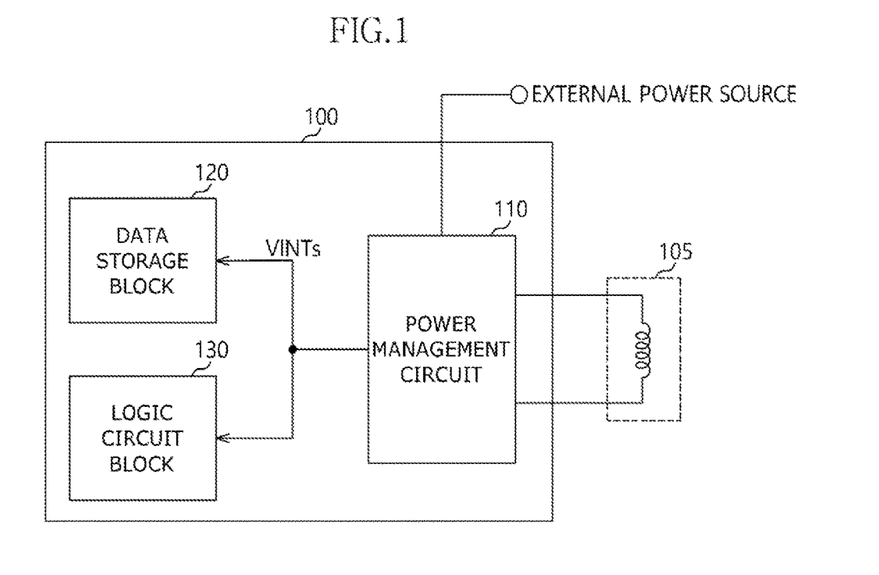
FIG. 1 is a schematic diagram illustrating a representation of an example configuration of a memory apparatus in accordance with an embodiment.

FIG. 1 is a schematic diagram illustrating a representation of an example configuration of a memory apparatus 100 in accordance with an embodiment. Referring to FIG. 1, the memory apparatus 100 may include a power management circuit 110. The power management circuit 110 may be embodied inside the memory apparatus 100, and thus may be an on-chip power management circuit. The power management circuit 110 may be coupled to an external power source and may receive external power from the external power source. The power management circuit 110 may generate one or more internal power from the external power. For example, the power management circuit 110 may generate a plurality of internal voltages VINTs from the external power. The power management circuit 110 may generate one or more internal voltages VINTs by regulating the external power. The external power may have a higher level than levels of the plurality of internal voltages VINTs used in the memory apparatus 100.

In general, a low drop out (LDO) regulator, which does not use an inductor, and a power management integrated circuit, which uses an inductor, are used to regulate a voltage. It is effective to use the LDO regulators, which does not use an inductor, in order to regulate voltages of similar levels because the LDO regulator has a small size. However, the LDO regulator has low efficiency when there is a great difference between an internal voltage generated from an external power and a voltage to be regulated. Therefore, a power management integrated circuit, which uses an inductor, is used to regulate a voltage having great voltage level difference. In this case, the inductor has a large circuit size and thus the power management integrated circuit is not embodied inside the memory apparatus and is embodied separately outside the memory apparatus. In an embodiment, the memory apparatus 100 may be coupled to an inductor 105 provided outside the memory apparatus 100. The inductor 105 may be an off-chip inductor because the inductor 105 is provided outside the memory apparatus 100. The power management circuit 110 may be coupled to the inductor 105 and may generate the plurality of internal voltages VINTs from the external power. The memory apparatus 100 may be coupled to an external device, and may include a plurality of pins or pads configured to receive and/or provide signals, voltages or powers from and/or to the external device. The memory apparatus 100 may be coupled to both ends of the inductor 105 through at least two pins or pads.

The memory apparatus 100 may further include one or more internal circuits configured to operate by using one or more internal voltages. The power management circuit 110 may generate one or more internal voltages from the external power, which are appropriate to be used in the internal circuits. The internal circuits may include one of a data storage block 120 and a logic circuit block 130. The data storage block 120 may include a memory cell array or a memory core. Also, the data storage block 120 may include circuits configured to control the memory cell array or the memory core. The data storage block 120 may include any circuit configured to store data in the memory cell array or the memory core or configured to output data stored in the memory cell array or the memory core. The logic circuit block 130 may include any interface circuit configured to communicate with an external device (e.g., a memory controller or a host) capable of communicating with the memory apparatus 100. Also, the logic circuit block 130 may include any circuit configured to couple the data storage block 120 to the interface circuit. The data storage block 120 may operate with a different internal voltage than the logic circuit block 130. The power management circuit 110 may generate the plurality of internal voltages VINTs to be used for the data storage block 120 and the logic circuit block 130. The data storage block 120 may operate with one or more of the plurality of internal voltages VINTs generated by the power management circuit 110. The logic circuit block 130 may operate using one or more of the plurality of internal voltages VINTs generated by the power management circuit 110.

The memory apparatus 100 may include the power management circuit 110, the power management circuit 110 may be coupled to the off-chip inductor 105, and the power management circuit 110 may generate the plurality of internal voltages VINTs. Therefore, the power management circuit 110 may possibly not include an inductor therein. In other words, the inductor 105 may be provided outside the power management circuit 110, and thus the power management circuit 110 may have a small circuit size and may be embodied inside the memory apparatus 100. The power management circuit 110 may be designed together with the data storage block 120 and the logic circuit block 130, and may generate the plurality of internal voltages VINTs appropriate to be used by the data storage block 120 and the logic circuit block 130. Therefore, the operation performance and reliability of the memory apparatus 100 may be increased.

The memory apparatus 100 may include one or more of a volatile memory and a nonvolatile memory. The volatile memory may include SRAM (Static RAM), DRAM (Dynamic RAM), SDRAM (Synchronous DRAM), and the nonvolatile memory may include ROM (Read Only Memory), PROM (Programmable ROM), EEPROM (Electrically Erase and Programmable ROM), EPROM (Electrically Programmable ROM), flash memory, PRAM (Phase change RAM), MRAM (Magnetic RAM), RRAM (Resistive RAM), FRAM (Ferroelectric RAM), and so forth. Further, the memory apparatus 100 may include a stacked memory apparatus or a multi-chip package, in which a plurality of chips are stacked.

Figure 2:
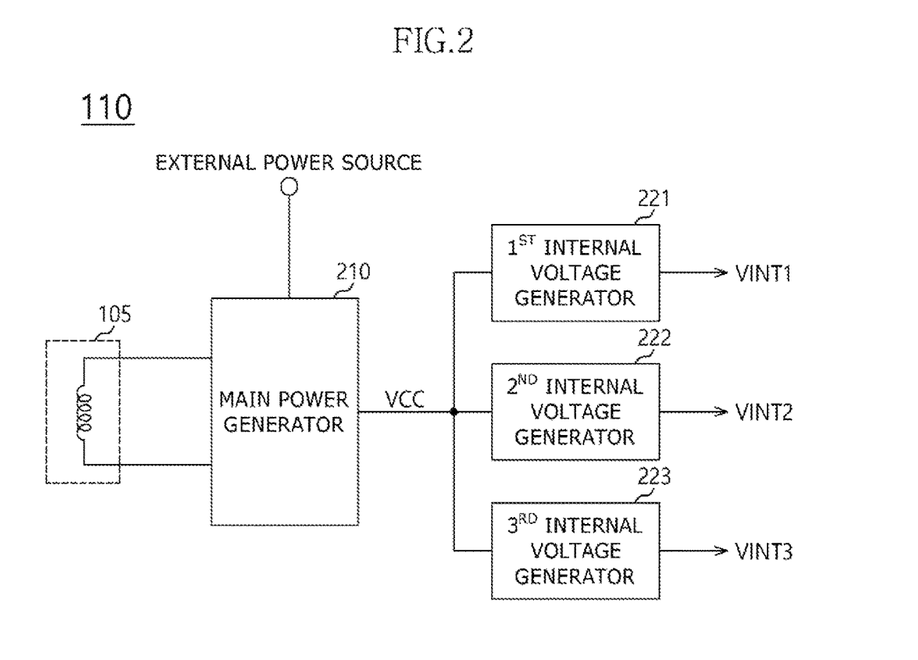
FIG. 2 is a schematic diagram illustrating a representation of an example configuration of a power management circuit shown in FIG. 1.

FIG. 2 is a schematic diagram illustrating a representation of an example configuration of the power management circuit 110 shown in FIG. 1. Referring to FIG. 2, the power management circuit 110 may include a main power generator 210 and a plurality of internal voltage generators 221, 222, and 223. The main power generator 210 may be coupled to the off-chip inductor 105, and may receive an external power from the external power source. The main power generator 210 may generate a memory power voltage VCC from the external power by using a corresponding off-chip inductor 105. The memory power voltage VCC may be used in the memory apparatus 100. The main power generator 210 may be coupled to the corresponding inductor 105 and may embody a buck-boost circuit or a DC-DC convertor configured to generate the memory power voltage VCC from the external power. That is, the main power generator 210 may include any element other than an inductor in a buck-boost circuit or a DC-DC convertor. A general buck boost circuit includes an inductor and thus has a great circuit size. However, the main power generator 210 may be coupled to the off-chip inductor 105 and may not need to include an inductor, and thus may be embodied to have a small circuit size.

The plurality of internal voltage generators 221, 222, and 223 may include first to third internal voltage generators 221, 222, and 223. FIG. 2 exemplifies three internal voltage generators 221, 222, and 223, which will not limit the scope of the present disclosure. A number of the internal voltage generators may depend on types of voltages used by the data storage block 120 and the logic circuit block 130 of the memory apparatus 100. The first internal voltage generator 221 may generate a first internal voltage VINT1 from the memory power voltage VCC. The second internal voltage generator 222 may generate a second internal voltage VINT2 from the memory power voltage VCC. The third internal voltage generator 223 may generate a third internal voltage VINT3 from the memory power voltage VCC. The first to third internal voltages VINT1, VINT2, and VINT3 may be used by the data storage block 120 and the logic circuit block 130 of the memory apparatus 100. For example, the first to third internal voltages VINT1, VINT2, and VINT3 may correspond to various voltages such as a core voltage, a data power voltage, a pumping voltage, and so forth.

Figure 3A:
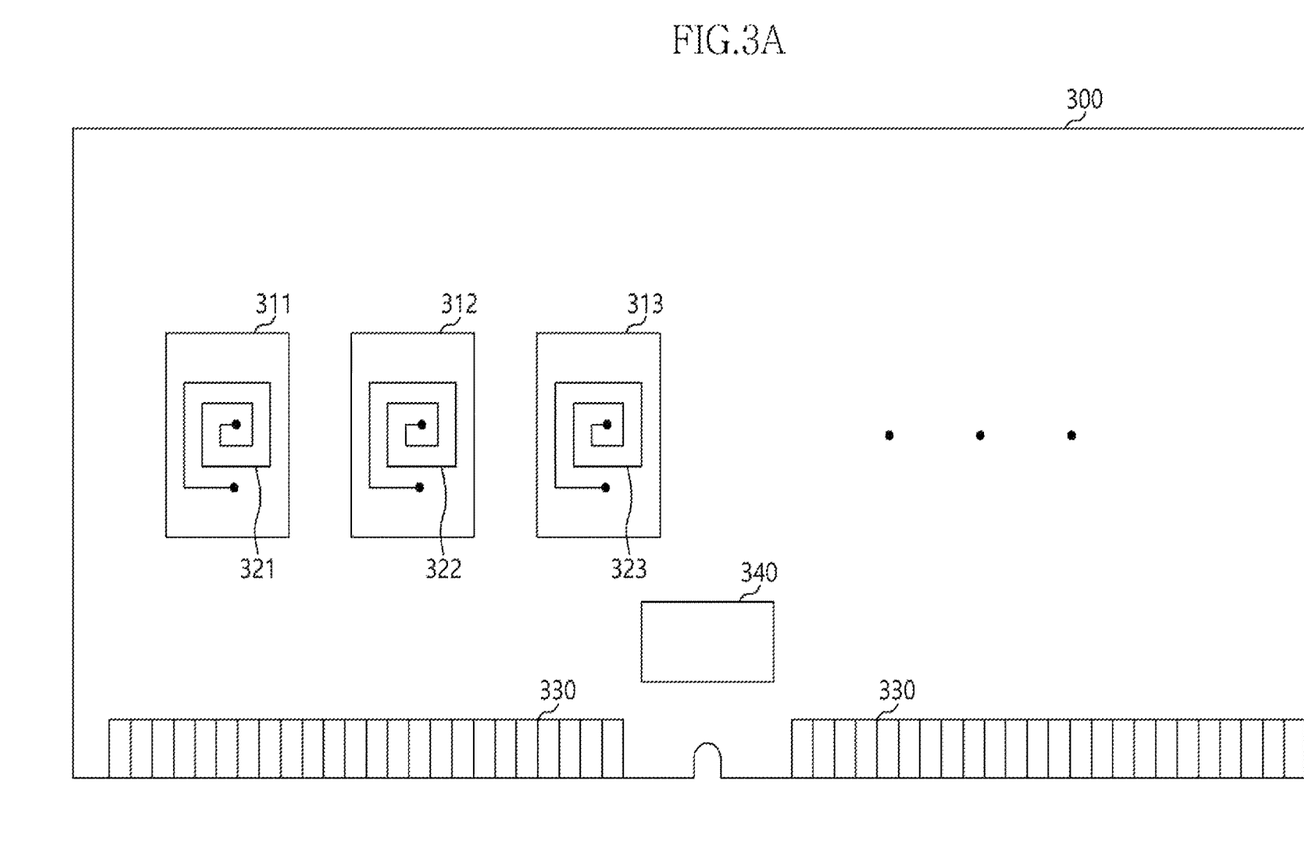
FIGS. 3A and 3B are schematic diagrams illustrating a representation of an example configuration of a module substrate in accordance with an embodiment.

FIGS. 3A and 3B are schematic diagrams illustrating a representation of an example configuration of a module substrate 300 in accordance with an embodiment. Referring to FIG. 3A, the module substrate 300 may include a plurality of regions 311, 312 and 313, on which a plurality of memory apparatuses are respectively mounted. In the plurality of regions 311, 312, and 313, inductors 321, 322 and 323 may be provided, respectively. The inductors 321, 322, and 323 may be provided through any metal line formed on the module substrate 300. A plurality of metal lines and insulating layers may be stacked to be used as signal transmission lines or power lines on the module substrate 300. The inductors 321, 322, and 323 may be embodied by using one or more of the plurality of metal lines. The inductors 321, 322, and 323 may be coupled to the memory apparatuses mounted on the plurality of regions 311, 312, and 313, respectively. The module substrate 300 may further include a module pin 330 and a buffer region 340. The module pin 330 may be mounted on a slot of a mainboard (not illustrated), and may be a channel or a link, through which the memory module communicates with an external device. A module buffer may be provided in the buffer region 340. The module buffer may include a register clock driver, a data buffer, an advanced memory buffer, and so forth.

Figure 3B:
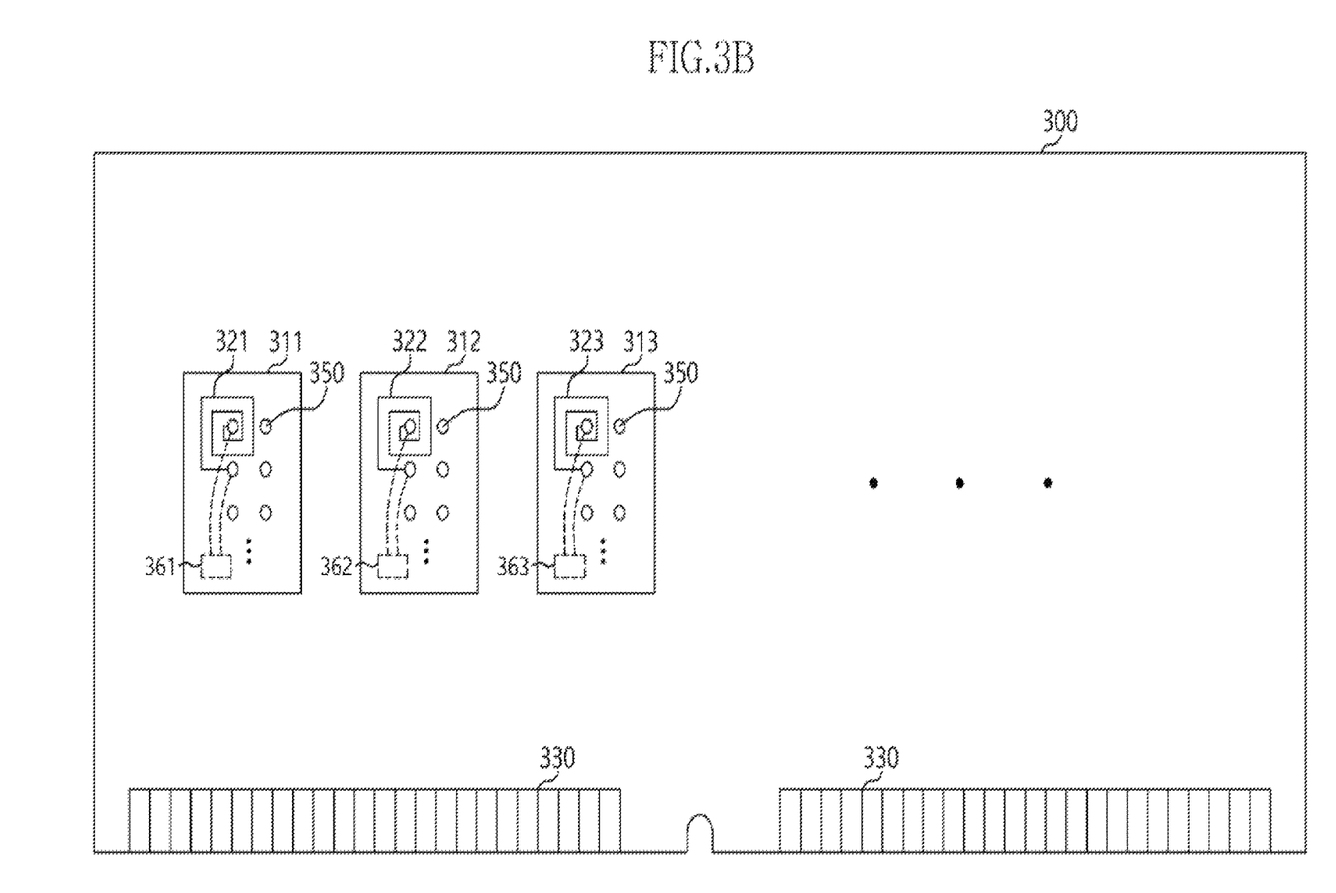

Referring FIG. 3B, the module substrate 300 may include a plurality of contacts 350 formed in and on each of the plurality of regions 311, 312, and 313. The plurality of contacts 350 may be solder contacts. The plurality of contacts 350 may be electrically coupled to a plurality of memory apparatuses when the plurality of memory apparatuses are mounted on the module substrate 300. According to the prior art, at least two of the plurality of contacts 350 may be used for receiving a power provided from an external source. For example, the at least two contacts may be used for receiving a memory power voltage provided from an external source. In an embodiment of this disclosure, however, the memory power voltage VCC may be generated by the power management circuit 110 within the memory apparatus 100, as described with reference to FIG. 1, and thus the memory apparatus 100 may not need to receive a memory power voltage provided from an external source. Therefore, both ends of each of the inductors 321, 322, and 323 and the plurality of memory apparatuses 100 may be coupled to at least two of the plurality of contacts used for receiving a memory power voltage provided from an external source among the plurality of contacts 350. Further, the inductors 321, 322, and 323 may be electrically coupled to the plurality of memory apparatuses and the power management circuits 361, 362, and 363 of the plurality of memory apparatuses mounted on the plurality of regions 311, 312 and 313, respectively. Accordingly, in one example, one of the plurality of inductors 321, 322, and 323 and the power management circuit 361, 362, and 363 of one of the plurality of memory apparatuses are coupled to each other through at least two of the plurality of contacts 350. Further, the first power management circuit 361 may be coupled to the first inductor 321 through at least two of the plurality of contacts 350. The second power management circuit 362 may be coupled to the second inductor 322 through at least two of the plurality of contacts 350. The third power management circuit 363 may be coupled to the third inductor 323 through at least two of the plurality of contacts 350.

Figure 4:
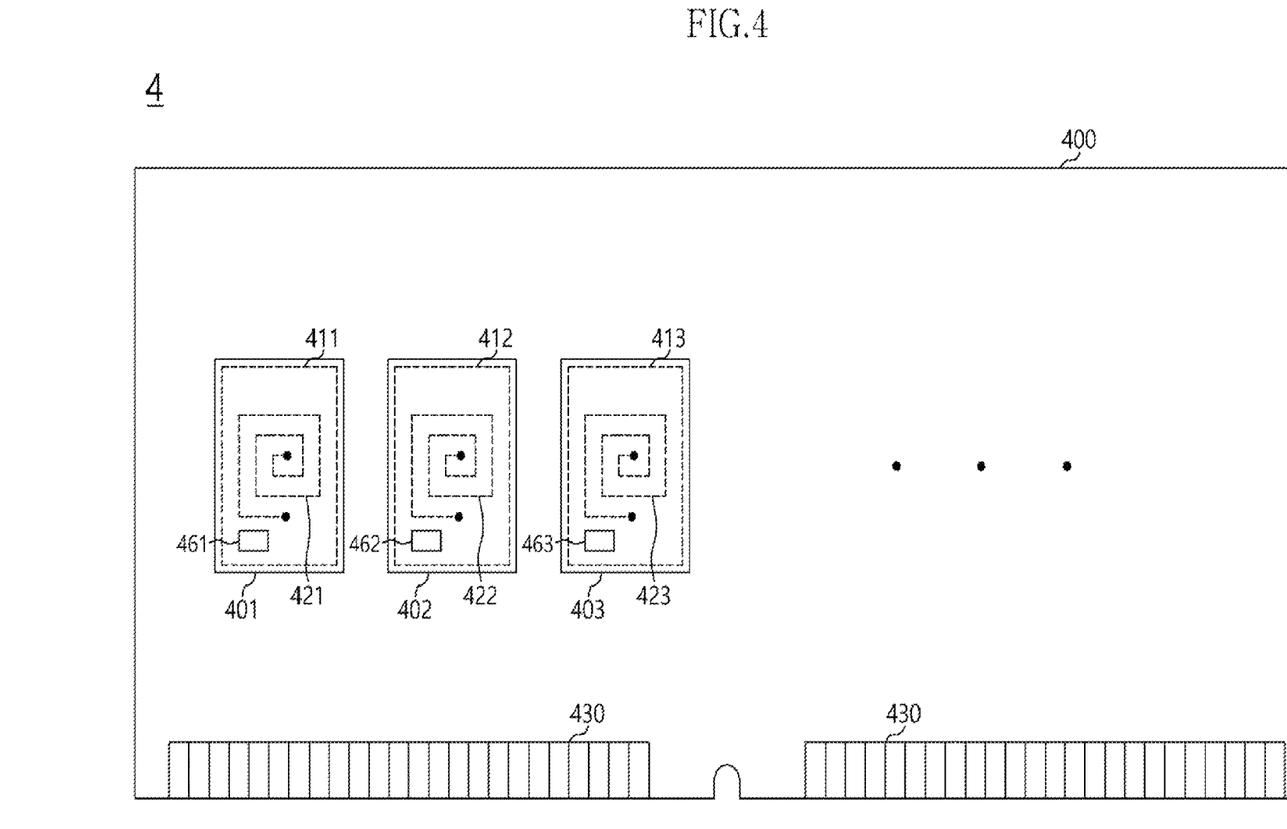
FIG. 4 is a schematic diagram illustrating a representation of an example configuration of a memory module in accordance with an embodiment.

FIG. 4 is a schematic diagram illustrating a representation of a configuration of a memory module 4 in accordance with an embodiment. Referring to FIG. 4, the memory module 4 may include a module substrate 400 and a plurality of memory apparatuses 401, 402, and 403. The module substrate 300 described with reference to FIG. 3 may be embodied as the module substrate 400. The module substrate 400 may include a plurality of regions 411, 412, and 413, to which the plurality of memory apparatuses 401, 402, and 403 are respectively mounted. In the plurality of regions 411, 412, and 413, inductors 421, 422, and 423 may be provided, respectively. The module substrate 400 may include a module pin 430 configured to form a channel capable of communicating with an external device. The plurality of memory apparatuses 401, 402, and 403 may be mounted on the plurality of regions 411, 412, and 413, respectively. The plurality of memory apparatuses 401, 402, and 403 may be mounted on the module substrate 400 through a solder connection. Therefore, the plurality of inductors 421, 422, and 423 may be provided under the plurality of memory apparatuses 401, 402 and 403, respectively. FIG. 4 represents the plurality of inductors 421, 422, and 423 with dotted line because the plurality of inductors 421, 422, and 423 are provided under the plurality of memory apparatuses 401, 402, and 403, respectively. The memory apparatus 100 described with reference to FIG. 1 may be embodied as each of the plurality of memory apparatuses 401, 402, and 403 illustrated in FIG. 4. Each of the plurality of memory apparatuses 401, 402, and 403 may include a power management circuit 461, 462, and 463. The power management circuits 461, 462, and 463 of the plurality of memory apparatuses 401, 402, and 403 may be coupled to the plurality of inductors 421, 422, and 423 formed in the plurality of regions 411, 412, and 413, respectively. The power management circuits of the plurality of memory apparatuses 401, 402, and 403 may receive external power. The power management circuits 461, 462, and 463 of the plurality of memory apparatuses 401, 402, and 403 may generate a memory power voltage and a plurality of internal voltages appropriate to be used by internal circuits of the plurality of memory apparatuses 401, 402, and 403 from the external power by using the plurality of inductors 421, 422, and 423 respectively coupled thereto.

For example, the memory module 4 may be embodied as one of UDIMM (Unbuffered Dual In-line Memory Module), DIMM (Dual Inline Memory Module), RDIMM (Registered Dual In-line Memory Module), LRDIMM (Load Reduced Dual In-line Memory Module), SODIMM (Small Outline Dual In-line Memory Module), and NVDIMM (Non-Volatile Dual In-line Memory Module). Further, the memory module 4 may include an advanced memory buffer capable of performing substantially similar functions to a memory controller or a host.

Figure 5:
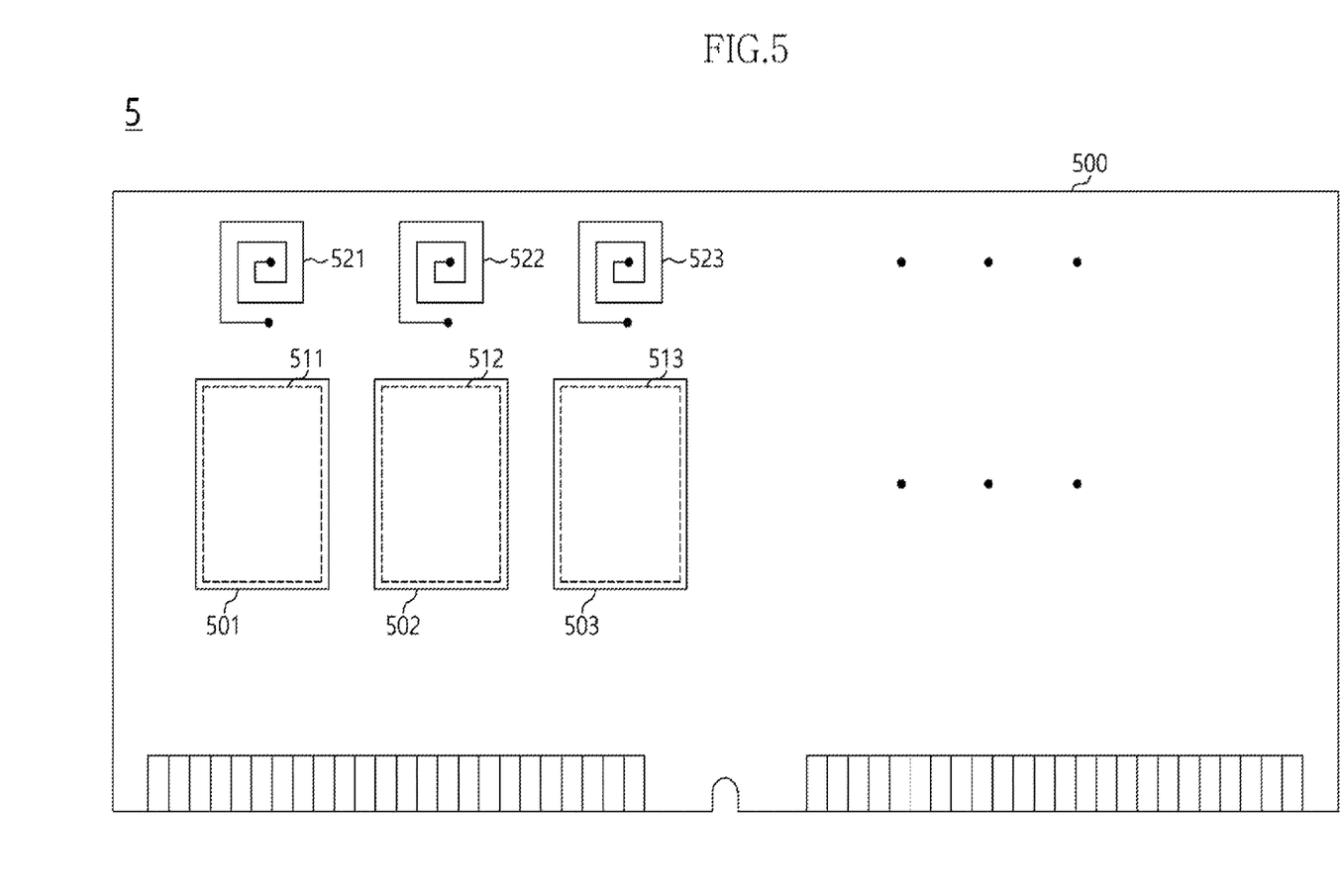
FIG. 5 is a schematic diagram illustrating a representation of an example configuration of a memory module in accordance with an embodiment.

FIG. 5 is a schematic diagram illustrating a representation of an example configuration of a memory module 5 in accordance with an embodiment. Referring to FIG. 5, the memory module 5 may include a module substrate 500 and a plurality of memory apparatuses 501, 502, and 503. The plurality of memory apparatuses 501, 502, and 503 may be mounted on a plurality of regions 511, 512, and 513 of the module substrate 500. A plurality of inductors 521, 522, and 523 may be formed on the module substrate 500. The plurality of inductors 521, 522, and 523 may be formed in regions other than the plurality of regions 511, 512, and 513, to which the plurality of memory apparatuses 501, 502, and 503 are mounted. Each of the plurality of memory apparatuses 501, 502 and 503 may include a power management circuit (not illustrated) configured to generate a memory power voltage and a plurality of internal voltages. The power management circuits of the plurality of memory apparatuses 501, 502, and 503 may be coupled to the plurality of inductors 521, 522, and 523, respectively, and may generate the memory power voltages and the plurality of internal voltages. In an embodiment, the plurality of power management circuits of the plurality of memory apparatuses 501, 502, and 503 may generate the memory power voltages and the plurality of internal voltages which may have different voltage levels. The plurality of power management circuits of the plurality of memory apparatuses 501, 502, and 503 may generate the memory power voltages and the plurality of internal voltages having appropriate voltage levels to be used by the plurality of memory apparatuses 501, 502, and 503 according to operation characteristics, process variables, and so forth of the plurality of memory apparatuses 501, 502, and 503, respectively. For example, the memory power voltage and the plurality of internal voltages generated by the power management circuit of the memory apparatus 501 may have different voltage levels from the memory power voltage and the plurality of internal voltages generated by the power management circuit of the memory apparatus 502, respectively. The plurality of power management circuits of the plurality of memory apparatuses 501, 502, and 503 may be designed to generate the memory power voltages and the plurality of internal voltages having appropriate voltage levels to operation characteristics of the plurality of memory apparatuses 501, 502, and 503, respectively. The plurality of power management circuits of the plurality of memory apparatuses 501, 502, and 503 may be designed to trim the memory power voltages and the plurality of internal voltages according to process variables of the plurality of memory apparatuses 501, 502, and 503, respectively.

Figure 6:
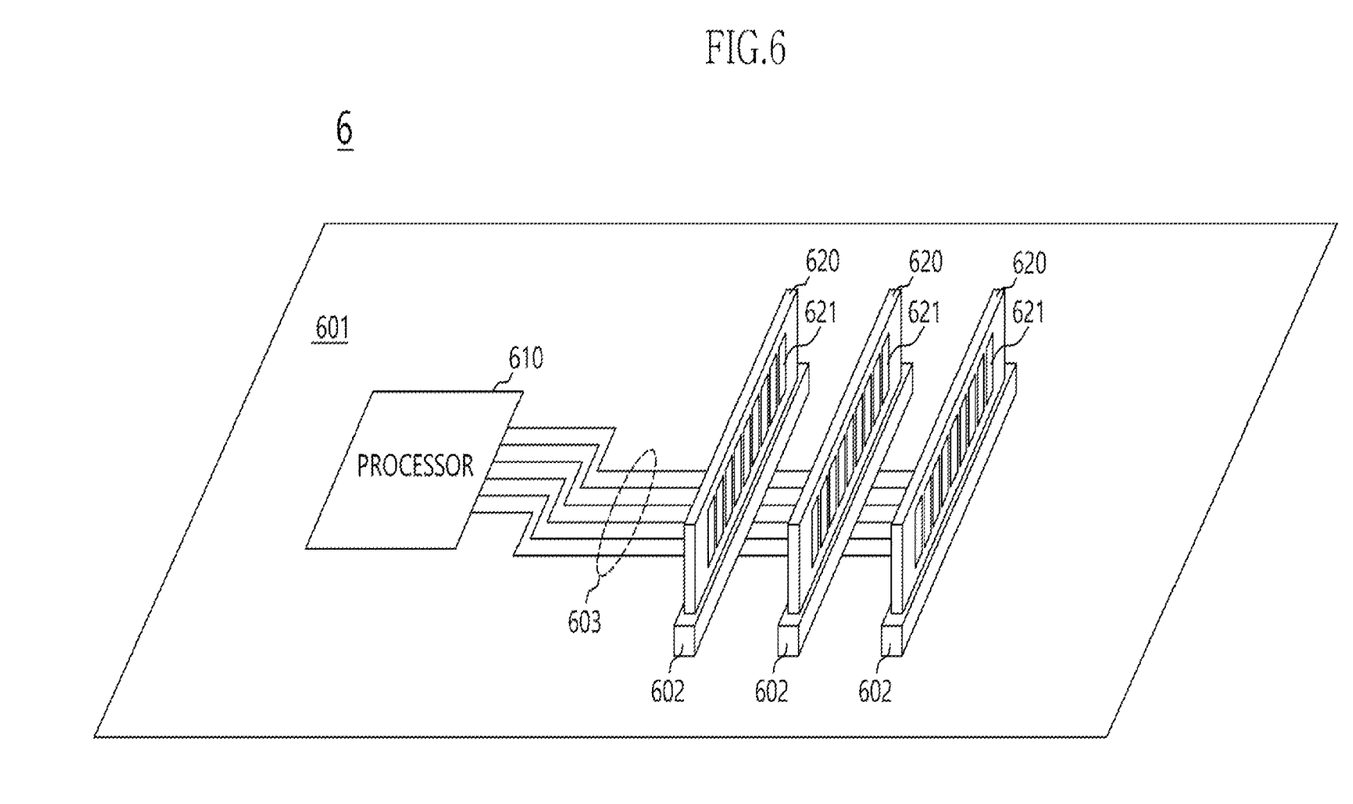
FIG. 6 is a schematic diagram illustrating a representation of an example configuration of an electronic device in accordance with an embodiment.

FIG. 6 is a schematic diagram illustrating a representation of an example configuration of an electronic device 6 in accordance with an embodiment. The electronic device 6 may be a computer device. The electronic device 6 may include a mainboard 601 and at least one memory module 620. The mainboard 601 may be a substrate, on which elements of the electronic device 6 are mounted, and may be referred to as a motherboard. The mainboard 601 may include a slot (not illustrated), on which a processor 610 is mounted, and a slot 602, on which the memory module 620 is mounted. The mainboard 601 may include one or more lines 603 electrically coupling the processor 610 and the memory module 620. The processor 610 may be mounted on the mainboard 601. The processor 610 may include a central processing unit (CPU), a graphic processing unit (GPU), a multi-media processor (MMP), and a digital signal processor (DSP). Also, the processor 610 may be embodied in the form of a system on a chip by combining multi-purpose processor chips such as an application processor (AP).

The memory module 620 may be mounted on the mainboard 601 through the slot 602 of the mainboard 601. The memory module 620 may be coupled to the lines 603 of the mainboard 601 through a module pin formed on the module substrate and the slot 602. For example, the memory module 620 may include UDIMM, DIMM, RDIMM, LRDIMM, SODIMM, NVDIMM, and so forth. Each of the memory modules 4 and 5 described with reference to FIGS. 4 and 5 may be embodied as the memory module 620. The memory module 620 may include a plurality of memory apparatuses 621. Each of the plurality of memory apparatuses 621 may be one or more of a volatile memory and a nonvolatile memory. The volatile memory may include SRAM, DRAM, SDRAM, and the nonvolatile memory may include ROM, PROM, EEPROM, EPROM, flash memory, PRAM, MRAM, RRAM, FRAM, and so forth. Further, the memory apparatus 621 may include a stacked memory apparatus or a multi-chip package, in which a plurality of chips are stacked. The memory apparatus 100 described with reference to FIG. 1 may be embodied as the memory apparatus 621 illustrated in FIG. 6.

While certain embodiments have been described above, it will be understood by those skilled in the art that the embodiments described are by way of example only.

Accordingly, the memory apparatus and memory module including a power management integrated circuit should not be limited based on the described embodiments. Rather, the memory apparatus and memory module including a power management integrated circuit described herein should only be limited in light of the claims that follow when taken in conjunction with the above description and accompanying drawings.

What is claimed is:

1. A memory module comprising a module substrate including a plurality of regions, on which a plurality of memory apparatuses are mounted,
wherein a plurality of inductors are formed in the plurality of regions of the memory module substrate, respectively.

2. The memory module of claim 1, wherein the plurality of inductors formed in the plurality of regions are coupled to the plurality of memory apparatuses mounted on the plurality of regions, respectively.

3. The memory module of claim 2, wherein each of the plurality of memory apparatuses includes a power management circuit configured to receive an external power and generate one or more internal voltages.

4. The memory module of claim 2, further comprising a plurality of contacts,
wherein the plurality of inductors formed in the plurality of regions and the plurality of memory apparatuses mounted on the plurality of regions are coupled to at least two of the plurality of contacts, respectively.

5. A memory module comprising:
a module substrate, on which a plurality of inductors are formed; and
a plurality of memory apparatuses each mounted on the module substrate and each including a power management circuit,
wherein the power management circuits of the plurality of memory apparatuses are coupled to the plurality of inductors, respectively.

6. The memory module of claim 5, wherein each of the plurality of inductors is formed in a corresponding region among the plurality of regions, where the plurality of memory apparatuses are mounted on the plurality of regions.

7. The memory module of claim 6, further comprising a plurality of contacts respectively formed on the plurality of regions, where the plurality of memory apparatuses are mounted on the plurality of regions,
wherein one of the plurality of inductors formed on one of the plurality of regions and the power management circuit of one of the plurality of memory apparatuses mounted on the one region are coupled to each other through at least one of the plurality of contacts formed on the one region.

8. The memory module of claim 5, wherein the power management circuit does not include an inductor.

9. The memory module of claim 5, wherein the power management circuit includes:
a main power generator configured to generate a memory power voltage from an external power by using a corresponding inductor coupled to the main power generator; and
one or more internal voltage generators configured to generate one or more internal voltages from the memory power voltage.

10. The memory module of claim 9, wherein each of the plurality of memory apparatuses includes:
a data storage block configured to operate by using the one or more internal voltages; and a logic circuit block configured to operate by using the one or more internal voltages.

11. The memory module of claim 9, wherein the main power generator forms a buck-boost circuit or a DC (Direct Current)-DC (Direct Current) converter together with the corresponding inductor coupled to the main power generator.

12. A memory apparatus comprising:
an on-chip power management circuit coupled to an off-chip inductor, and configured to receive an external power and generate one or more internal voltages; and
one or more internal circuits configured to operate by using the one or more internal voltages.

13. The memory apparatus of claim 12, wherein the on-chip power management circuit includes:
a main power generator configured to generate the memory power voltage from the external power by using the off-chip inductor; and
one or more internal voltage generators configured to generate the one or more internal voltages from the memory power voltage.

14. The memory apparatus of claim 12, wherein each of the internal circuits includes:
a data storage block configured to operate by using the one or more internal voltages; and
a logic circuit block configured to operate by using the one or more internal voltages.

15. A memory module comprising:
a module substrate including a first inductor formed in a first region and a second inductor formed in a second region;
a first memory apparatus mounted on the first region, and including a first power management circuit; and
a second memory apparatus mounted on the second region, and including a second power management circuit,
wherein the first power management circuit is coupled to the first inductor and generates a memory power voltage and a plurality of internal voltages appropriate to be used by the first memory apparatus, and
wherein the second power management circuit is coupled to the second inductor and generates a memory power voltage and a plurality of internal voltages appropriate to be used by the second memory apparatus.

16. The memory module of claim 15, further comprising a plurality of contacts formed on the first region,
wherein the first power management circuit is coupled to the first inductor through at least two of the plurality of contacts.

17. The memory module of claim 15, further comprising a plurality of contacts formed on the second region,
wherein the second power management circuit is coupled to the second inductor through at least two of the plurality of contacts.

18. The memory module of claim 15, wherein the first inductor is formed under the first memory apparatus.

19. The memory module of claim 15, the second inductor is formed under the second memory apparatus.

* * * * *